United States Patent
Ries et al.

(10) Patent No.: US 9,534,294 B2
(45) Date of Patent: Jan. 3, 2017

(54) CLEANING METHOD FOR THIN-FILM PROCESSING APPLICATIONS AND APPARATUS FOR USE THEREIN

(71) Applicant: Applied Materials, Inc., Santa Clara, CA (US)

(72) Inventors: Florian Ries, Westerngrund (DE); Stefan Hein, Blankenbach (DE); Stefan Lorenz, Karlstein (DE); Neil Morrison, Darmstadt (DE); Tobias Stolley, Oberursel (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 581 days.

(21) Appl. No.: 13/965,968

(22) Filed: Aug. 13, 2013

(65) Prior Publication Data
US 2015/0020847 A1  Jan. 22, 2015

(30) Foreign Application Priority Data

Jul. 17, 2013 (EP) ..................................... 13176899

(51) Int. Cl.
C25F 1/00 (2006.01)
C23C 16/44 (2006.01)
H01J 37/32 (2006.01)

(52) U.S. Cl.
CPC ....... *C23C 16/4405* (2013.01); *H01J 37/3277* (2013.01); *H01J 37/32862* (2013.01); *Y10T 428/18* (2015.01); *Y10T 428/192* (2015.01)

(58) Field of Classification Search
None
See application file for complete search history.

(56) References Cited

U.S. PATENT DOCUMENTS 3,956,093 A * 5/1976 McLeod ............ H01J 37/3408
204/192.12
2010/0071722 A1  3/2010 Nakagame

FOREIGN PATENT DOCUMENTS

| JP | 2008057020 | 3/2008 |
| JP | 2009138239 | 6/2009 |
| JP | 2010185099 | 8/2010 |

OTHER PUBLICATIONS

Extended European Search Report dated Sep. 18, 2013 for Application No. 13176899.6.

* cited by examiner

*Primary Examiner* — Binh X Tran
*Assistant Examiner* — David Cathey, Jr.
(74) *Attorney, Agent, or Firm* — Patterson & Sheridan, LLP

(57) ABSTRACT

According to the present disclosure, a method for cleaning the processing chamber of a flexible substrate processing apparatus without breaking the vacuum in the processing chamber is provided. The method for cleaning the processing chamber includes guiding a sacrificial foil into the processing chamber; initiating a first pump process in the processing chamber; plasma cleaning the processing chamber while the sacrificial foil is provided in the processing chamber; initiating a second pump process in the processing chamber; and guiding a flexible substrate into the processing chamber.

12 Claims, 5 Drawing Sheets

CLEANING METHOD FOR THIN-FILM PROCESSING APPLICATIONS AND APPARATUS FOR USE THEREIN

TECHNICAL FIELD OF THE INVENTION

Embodiments of the present invention relate to thin-film processing apparatuses, particularly to cleaning methods thereof, and more particularly to cleaning methods of roll-to-roll (R2R) systems. Embodiments of the present invention particularly relate to apparatuses and methods for plasma cleaning processing chambers of R2R chemical vapor deposition (CVD) systems.

BACKGROUND OF THE INVENTION

Processing of flexible substrates, such as plastic films or foils, is in high demand in the packaging industry, semiconductor industries and other industries. Processing may include coating of a flexible substrate with a desired material, such as a metal, semiconductors and dielectric materials, etching and other processing steps conducted on a substrate for the desired applications. Systems performing this task generally include a processing drum, e.g., a cylindrical roller, coupled to a processing system for transporting the substrate, and on which at least a portion of the substrate is processed. Roll-to-roll coating systems can, thereby, provide a high throughput system.

Typically, a coating process, such as a chemical evaporation process or a thermal evaporation process, can be utilized for depositing thin layers of materials onto flexible substrates. However, Roll-to-Roll deposition systems are also experiencing a strong increase in demand in the display industry and the photovoltaic (PV) industry. For example, touch panel elements, flexible displays, and flexible PV modules result in an increasing demand of depositing suitable layers in Roll-to-Roll coaters, particularly with low manufacturing costs. However, such devices typically have several layers, which are typically manufactured with CVD processes and particularly also PECVD processes.

Deposition apparatuses with e.g. CVD, PECVD and/or PVD sources, wherein different residues from gas mixtures are deposited in the same processing region in subsequent uses of the equipment have the need of in depth cleaning procedures in order to avoid cross contamination effects and to ensure the long term process stability. Commonly, for this purpose, processing chambers are opened and cleaned manually, which may result in increased machine downtime.

Over the years, layers in display devices have evolved into multiple layers with each layer serving a different function. Depositing multiple layers onto multiple substrates may require multiple processing chambers, all of which need to be kept clean in order to maintain a high manufacturing quality. Generally, the cleaning procedures involved therein may decrease substrate throughput. Therefore, there is a need in the art for an efficient cleaning method and apparatus for processing flexible substrates, such as OLED structures, semiconductor structures and other modern more sophisticated devices to ensure substrate throughput is maximized.

SUMMARY OF THE INVENTION

In light of the above, an apparatus for processing flexible substrates and a method for cleaning a processing chamber thereof is provided. Further aspects, advantages, and features of the present invention are apparent from the dependent claims, the description, and the accompanying drawings.

In one aspect, a method for cleaning the processing chamber of a flexible substrate processing apparatus without breaking the vacuum in the processing chamber is provided. The method includes the following steps: guiding a sacrificial foil into the processing chamber; initiating a first pump process in the processing chamber; plasma cleaning the processing chamber while the sacrificial foil is provided in the processing chamber; initiating a second pump process in the processing chamber; and guiding a flexible substrate into the processing chamber.

In another aspect, a roll including a flexible substrate for use in an apparatus for processing a flexible substrate is provided. The flexible substrate including a sacrificial foil attached thereto.

In yet another aspect, an apparatus for processing a flexible substrate is provided. The apparatus including a processing chamber, a gap sluice and a controller for executing a method for cleaning the processing chamber without breaking the vacuum in the processing chamber according to embodiments described herein.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF EMBODIMENTS

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

It is noted here that a flexible substrate or web as used within the embodiments described herein can typically be characterized in that it is bendable. The term "web" may be synonymously used with the term "strip" or the term "flexible substrate". For example, the web, as described in embodiments herein, may be a foil or another flexible substrate.

As used herein, the term "gap sluice" is intended to be representative of a channel or lock that may typically be used to seal, e.g. hermetically seal, a chamber of an apparatus for processing flexible substrates.

As used herein, the term "sacrificial foil" is intended to be representative of a foil, which is typically made of a material that is different than the material of the flexible substrate. For instance, the foil may consist of a metal alloy such as, e.g., stainless steel. According to embodiments herein, the sacrificial foil may for instance have a thickness of 10 µm to 200 µm, particularly of 50 µm to 125 µm.

Embodiments described herein, generally relate to methods for cleaning the processing chamber of a flexible substrate processing apparatus, in particular, without breaking the vacuum in the processing chamber. Typically, such cleaning procedures employ a sacrificial foil that can, e.g., be pre-attached at the end, start or in-between sections of a flexible substrate. For instance, the sacrificial foil may connect the flexible substrate to a roll. In further embodiments, two or more sacrificial foils may separate the flexible substrate into a multitude of distinct sections interconnected by the sacrificial foils.

Figure 1:
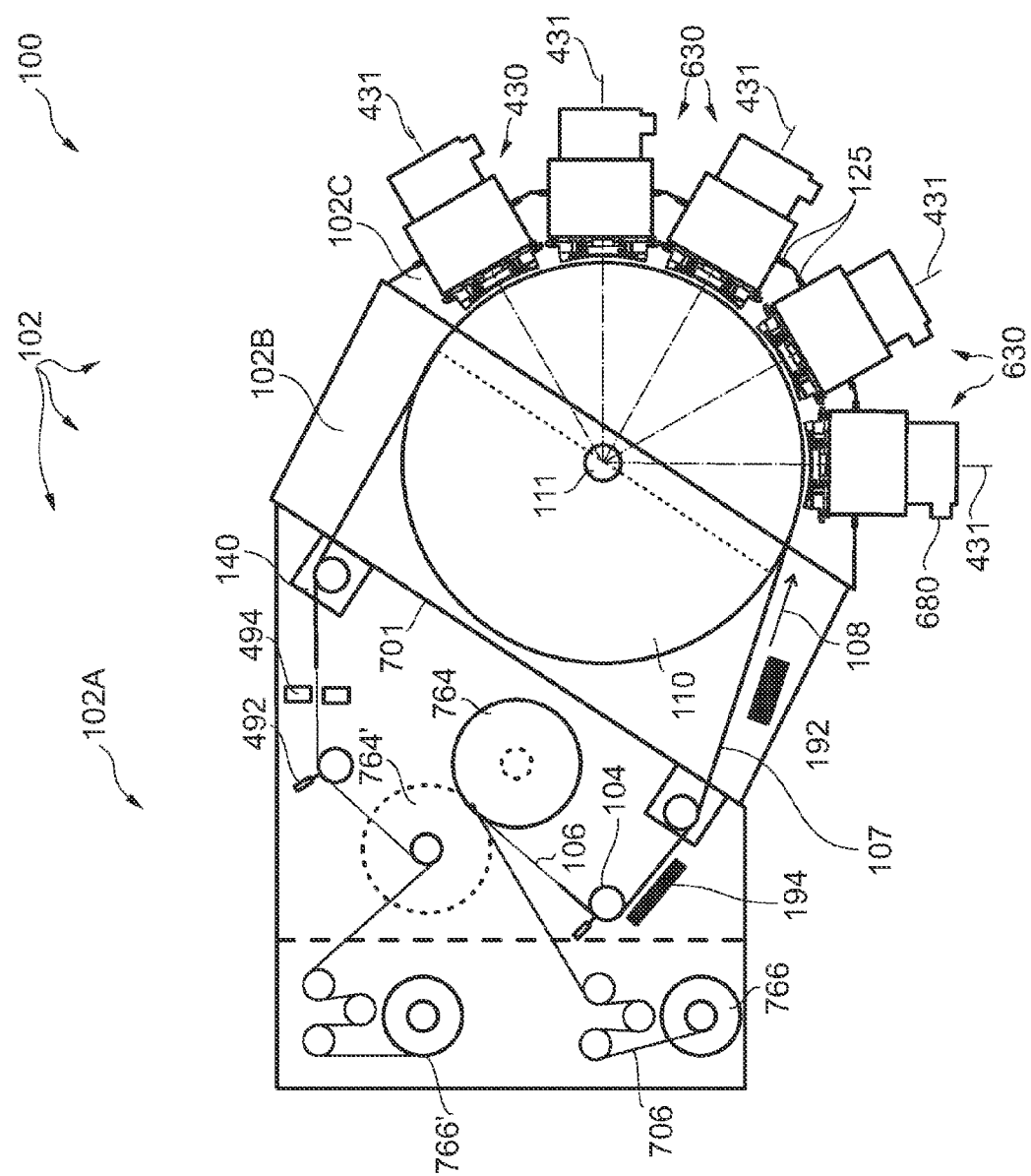
FIG. 1 shows a schematic view of a roll-to-roll deposition apparatus for depositing or coating the thin-film according to embodiments described herein.

A typical flexible substrate processing apparatus, which may be used for depositing a thin film on a flexible substrate, according to embodiments described herein, is exemplarily shown in FIG. 1. The processing apparatus 100 shown therein generally includes a vacuum chamber 102. The vacuum chamber has a first chamber portion 102A, a second chamber portion 102B and a third chamber portion 102C. The first chamber portion 102A is configured as a winding/unwinding chamber and can be separated from the remaining portions of the chamber for exchange of the flexible substrate such that the remaining chamber portions 102B/C do not need to be vented for removing the processes flexible substrate and evacuated after the new substrate has been inserted. Thereby, the downtime of the apparatus can be reduced. Accordingly, the overall objective of increased throughput can be served. It is noted that the second chamber portion 102B and the third chamber portion 102C may herein collectively be referred to as the "processing chamber". According to some embodiments, which can be combined with other embodiments described herein the second and the third chamber portion may also be provided as one single chamber.

With respect to FIG. 1, the substrate is provided on a first roll 764 having a shaft, which is e.g. used for unwinding. The substrate is wound on a second roll 764' having a shaft, which is e.g. used for winding. However, it is understood that the substrate can also be guided through the apparatus 100 in reverse direction such that the shafts can be used for winding instead of unwinding and for unwinding instead of winding. Accordingly, the unwinding shaft for supporting the flexible substrate to be processed and the winding shaft supporting the flexible substrate having the processed thin film thereon are provided in the first chamber portion 102A. The flexible substrate 106 is provided on a first roll 764, e.g. having a winding shaft.

Figure 2:
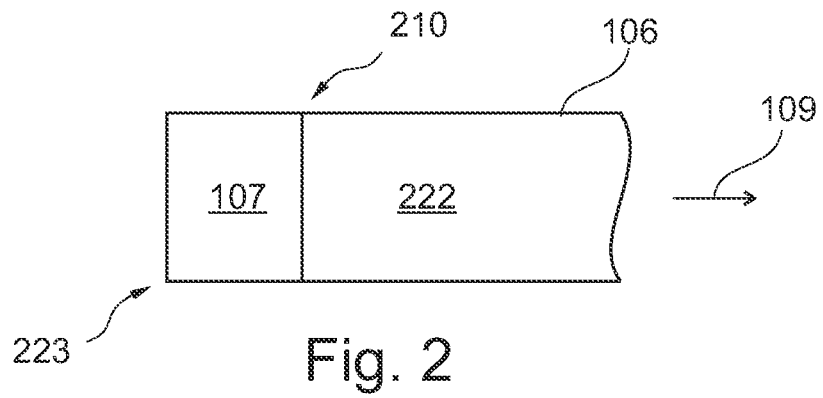
FIGS. 2-4 show schematic views of flexible substrates according to embodiments described herein.
Figure 3:
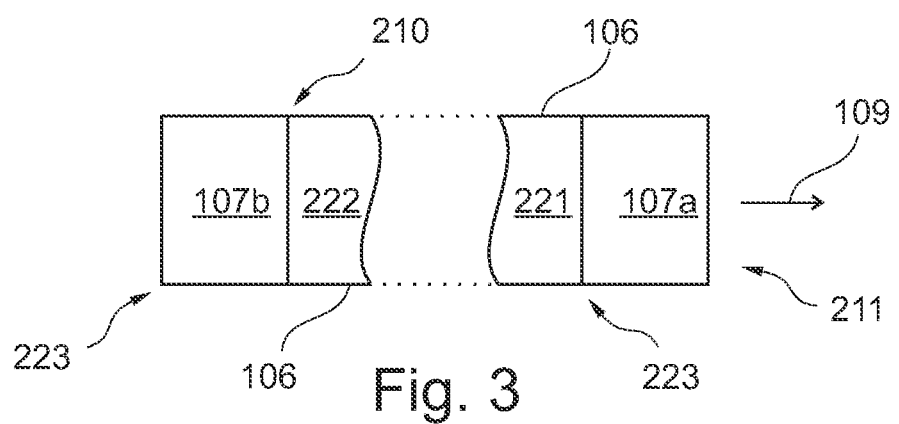
Figure 4:
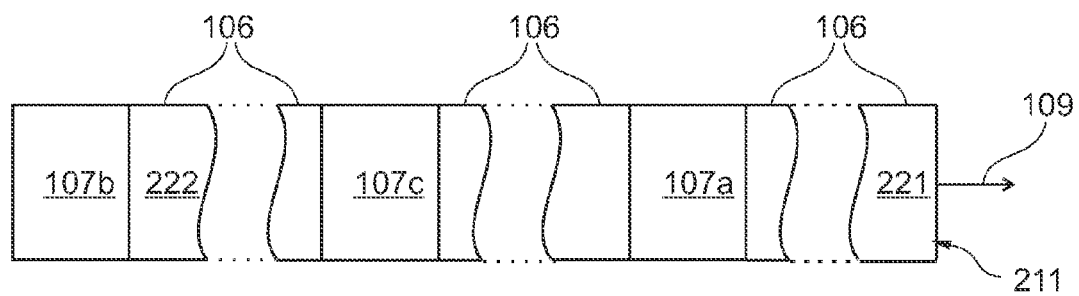

According to embodiments described herein, a flexible substrate may include at least one sacrificial foil 107 (see FIG. 2). The sacrificial foil may be attached at the start, end or somewhere in-between the flexible substrate thereby separating the flexible substrate into at least two distinct sections. In general, the start section may be defined as being the section of the flexible substrate and/or sacrificial foil which enters first into the processing chamber of a flexible substrate processing apparatus. FIGS. 2-4 show various embodiments of a flexible substrate 106 including sacrificial foil 107. Arrow 109 generally indicates the movement direction of the flexible substrate and/or sacrificial foil into a processing chamber of a flexible substrate processing apparatus.

In FIG. 2, for instance, the flexible substrate 106 may include a sacrificial foil 107. A front section 210 of the sacrificial foil 107 may be pre-attached to an end section 222 of the flexible substrate 106. Further, an end section 223 of the sacrificial foil may be pre-attached to a roll (not shown in the figure).

FIG. 3 shows two sacrificial foils 107a, 107b pre-attached to a flexible substrate 106 according to embodiments described herein. The end section 223 of the first sacrificial foil 107a may be pre-attached to a front section 221 of the flexible substrate 106 and the front section 210 of the second sacrificial foil 107b may be pre-attached at an end section 222 of the flexible substrate 106. Generally, the front section 211 of the first sacrificial foil 107a may be connected to the end section of another flexible substrate. Having a sacrificial foil at the beginning and at the end of the flexible substrate allows e.g. for using a regular roll without sacrificial foil every second time.

According to further embodiments described herein, a flexible substrate 106 may include a plurality of sacrificial foils 107. For instance, FIG. 4 shows a flexible substrate 106 including three sacrificial foils 107, which separate the flexible substrate into three distinct sections. The sacrificial foils 107a, 107b, and 107c may be pre-attached in-between the flexible substrate 106. The sacrificial foils 107a, 107b and 107c separate the flexible substrate into distinct sections that may have the same length. In embodiments described herein, the aforementioned distinct sections may be of different lengths. Not limited to any particular embodiment described herein, the flexible substrate may include two or more, three or more, four or more, five or more, six or more, or even seven or more sacrificial foils attached at the start, end or somewhere along the longitudinal axis of the planar (unrolled) flexible substrate separating the flexible substrate into discrete sections. For instance, each discrete section may be anywhere from 30 m to 1000 m long, in particular from 50 m to 500 m long.

Figure 5:
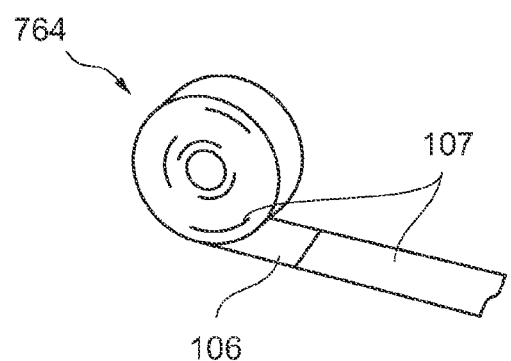
FIG. 5 shows a schematic perspective view of a roll according to embodiments described herein.

FIG. 5 shows an exemplary roll 764 for use in a flexible substrate processing apparatus. The roll 764 may include a flexible substrate 106 and one, two, three, four, five or more sacrificial foils 107.

Figure 6:
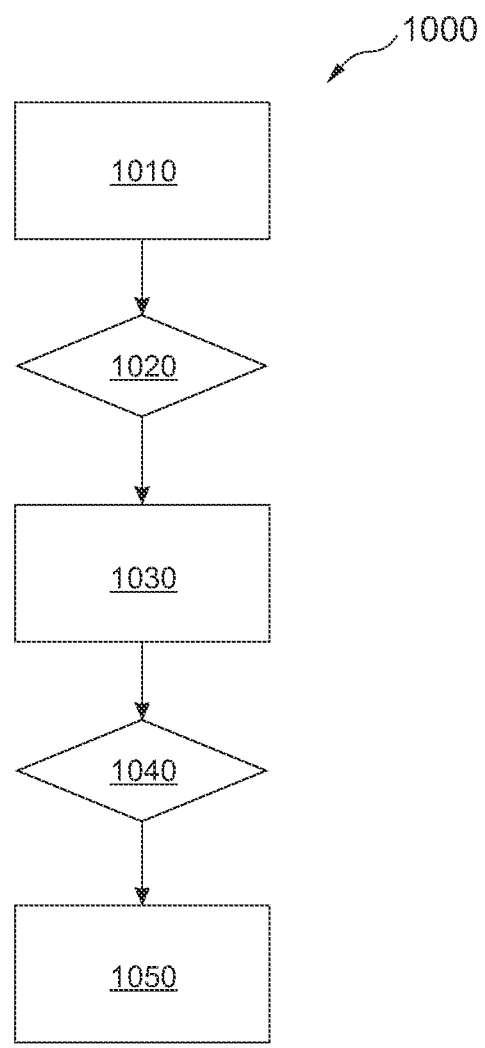
FIGS. 6-7 show flow charts of a method for cleaning the processing chamber of a flexible substrate processing apparatus according to embodiments described herein.

In general, the embodiments described herein relate to flexible substrate apparatuses as exemplarily described above and to methods and devices for cleaning, in particular, a processing chamber of such apparatuses. For example, FIG. 6 illustrates a method 1000 for cleaning the processing chamber of a flexible substrate processing apparatus according to embodiments described herein, and may generally be described to include: guiding a sacrificial foil into the processing chamber (see 1010); initiating a first pump and/or purge process in the processing chamber (see 1020); plasma cleaning the processing chamber (see 1030); initiating a second pump and/or purge process in the processing chamber (see 1040); and guiding a flexible substrate into the processing chamber (see 1050). Thereby, the order of the steps, particularly with respect to pump and purge steps can be arbitrary as long as the sacrificial foil is provided in the processing chamber during the plasma cleaning.

Returning now to FIG. 1, according to some embodiments, which can be combined with other embodiments described herein, the flexible substrate to be processed can be provided on the roll 764 together with an interleaf 706. Thereby, the interleaf can be provided between adjacent layers of the flexible substrate such that direct contact of one layer of the flexible substrate with an adjacent layer of the flexible substrate on roll 764 can be omitted. According to typical embodiments, the substrate is guided via one, two or more rollers 104 from the roll 764 to the coating drum (hereinafter also referred to as a processing drum) and from the coating drum to the second roll 764', e.g. having a winding shaft, on which the substrate is wound after processing thereof. After processing, a further interleaf can be provided from interleaf roll 766' between the layers of the flexible substrate 106, which is wound on to the roll 764'.

According to the embodiments described herein, at least one gap sluice 140 for separating the first chamber portion from the second chamber portion is provided at a separation wall 701. As shown in FIG. 1 typically two gap sluices are provided. The one or more gap sluices are configured such that the flexible substrate can move there through and the gap sluice can be opened and closed for providing a vacuum seal. According to typical embodiments, a gap sluice includes a roller for guiding the substrate and/or sacrificial foil, e.g. for redirecting the substrate and/or sacrificial foil movement by an angle of 10° or above. Further, an inflatable seal is provided that can be pressed against the roller of the gap sluice. The gap sluice is closed by inflating the seal and the first chamber portion 102A and the second chamber portion 102B are separated from each other in a vacuum tight manner. Thus, the first chamber portion 102A can be vented while the second chamber portion 102B can be maintained under technical vacuum.

According to embodiments described herein, a gap sluice can for example be opened and closed to seal the processing region or processing regions from the winding region. Typically, opening and closing can also be conducted with a substrate or a sacrificial foil provided in the gap sluice. Accordingly, a gap sluice as described herein can also be understood as a load lock or can be referred to as a load lock, respectively. Thus, both terms can be exchanged according to the present disclosure.

According to a further alternative implementation, the gap sluice can also be provided without a roller. An inflatable seal can press the substrate against a flat sealing surface. Yet, also other means for selectively opening and closing gap sluice can be utilized wherein opening and closing, i.e. having an open substrate path and a vacuum seal, can be conducted while the substrate is inserted. The gap sluice for closing the vacuum seal while the substrate and/or sacrificial foil is inserted allows for particularly easy exchange of the substrate, as the substrate from the new roll can be attached to the substrate and/or sacrificial foil from the previous roll and the flexible substrate can be wound through the system while chamber portions 102B and 102C are evacuated by pulling the previous substrate with the new substrate attached thereto through the apparatus.

As further shown in FIG. 1, the wall 701 and/or the axis defined by the distance between the gap sluices 140, which are capable of providing a vacuum separation between the first chamber portion 102A and the second chamber portion 102B, can be inclined with respect to a vertical or horizontal orientation. Typically, the angle of inclination can be 20° to 70° relative the vertical. Thereby, the inclination is such that the coating drum is displaced downwardly as compare to a horizontal arrangement of the similar components without inclination. The inclination of the wall and/or the axis defined between the gap sluices allows for providing additional processing stations or deposition sources 630 to be provided such that its axis 431, e.g. the symmetry axis of a plasma electrode (not shown in FIG. 1) is on the same height or below the rotation axis 111 of the coating drum 110. As shown in FIG. 1, the four deposition sources 630 are provided at the height of the rotation axis 111 of the coating drum 110 or below. As described above flaking and falling of generated particles on the substrate can thereby, be reduced or omitted. The fifth processing station, which is shown as an etching station 430 in FIG. 1 can, for example, be provided above the rotation axis 111 of the coating drum 110. However, it will be understood that an etching station 430 can also be provided at any of the other positions of the convex wall portion of the chamber portion 102C. Similarly, one or more heating stations can be provided along the curved surface of the coating drum 110.

According to yet further embodiments that can be combined with other embodiments described herein, optionally also an optical measurement unit 494 for evaluating the result of the substrate processing and/or one or more ionization units 492 for adapting the charge on the substrate can be provided.

According to embodiments described herein, a first portion of the coating drum, i.e. an area of the cross-section of the coating drum perpendicular to the rotation axis, is provided in the second chamber portion 102B and the remaining portion of the coating drum, i.e. an area of the cross-section of the coating drum perpendicular to the rotation axis, is provided in the third chamber portion 102C. As can be seen by the dotted line in FIG. 1, typically, the first portion is larger than the remaining portion, i.e. the axis 111 is provided in the second chamber portion 102B. Providing the axis 111 in the second chamber portion provides easier and, thus, more cost efficient design of the apparatus, which also serves CoO. For example, the ratio of the first portion of the coating drum and the remaining portion of the coating drum can be 1.1:1 or larger. Yet, from a mechanical point of view the axis might be moved towards the third chamber portion 102C to be slightly over the border from the second to the third portion without deteriorating the stability of the system too much. Accordingly the ratio might also be 0.8:1 or larger.

According to embodiments described herein, the third chamber portion 102C has a convex shape wall portion. Thereby, convex is to be understood as either having a curved surface of the wall portion or having a plurality of flat surfaces adjacent to each other in order to provide for a convex shape of the plurality of surfaces. According to typical embodiments, the plurality of flat surfaces forming together the convex shape has the advantage that the below-mentioned vacuum flange connections can be provided at a flat surface, which is easier to manufacture. The easier manufacturing again reduces the costs of the equipment.

FIG. 1 shows a plurality of processing station corresponding to a plurality of vacuum processing regions. According to embodiments described herein, at least two processing stations are provided, wherein at least two processing stations include a flange portion 125 for providing a vacuum connection to the third chamber portion 102C. Typically, the third chamber portion has a convex shaped wall portion and at least two openings essentially parallel thereto, for example the at least two openings are provided within the convex shaped wall portion or in a protrusion extending from the convex shaped wall portion, i.e. an extension of the convex shaped wall portion protruding essentially radially outward with respect to the coating drum axis. The at least two processing stations are configured to be received in the at least two openings of the third chamber portion. Thereby, the flange portions 125 provide a vacuum tight connection with the convex shaped wall portion of the third chamber portion or with the protrusion extending from the convex shaped wall portion.

Accordingly, the processing stations can be inserted from outside of the convex shaped wall portion of the third chamber portion 102C. On insertion, a vacuum flange can be connected and a vacuum region is provided in the third chamber portion. According to typical embodiments, the processing stations can be inserted in the openings along an essential radial direction with respect to the axis of the coating drum 110.

As described above, a portion of the processing stations are thus provided in vacuum, i.e. within the third chamber portion and/or inside with respect to the flange. Another portion of the processing stations is provided outside of the region in which the vacuum in the vacuum chamber 102 is provided. This allows for an easy exchange of the processing stations and supply of consumption media like cooling fluid, gas, electric power etc. According to some implementations, at least the connection of the processing station to the match circuit 680 is provided outside the third chamber portion 102C and, thereby forms the above-mentioned another portion outside of the region. Further, the openings in the wall portion of the third chamber portion or in the protrusion extending from the convex shaped wall portion are typically shaped to have a predetermined shape and size. There is a standardized opening such that different processing stations with a flange configured to fit the standardized opening can be exchangeable utilized at different processing regions. This results in easier maintenance and increased flexibility of utilization of the apparatus 100. Again CoO can be reduced in light of the reduced downtime (easier maintenance) and in light of the flexible utilization. The latter results in the fact that different products can be manufactured on one apparatus such that an owner can switch between manufacturing of different products on the same processing apparatus 100.

According to yet further embodiments the distance of the curved outer surface of the coating drum 110 and the flange or the convex shape of the chamber can be from 10 mm to 500 mm. Thereby, the distance refers to the dimension from the coating drum surface to the inner wall or flange portion, which delimits the vacuum area of the chamber 102. Providing the convex shape and the dimensions mentioned above allow for a reduced chamber volume in the third chamber portion 102C. The reduced chamber volume in the third portion allows for easier gas separation and easier evacuation of processing zones. For example, the second chamber portion has a volume of the evacuatable region and the third chamber portion has a further volume of the further evacuatable region and the ratio of the volume to the further volume is at least 2:1, such as 3:1 to 6:1

According to yet further implementations, areas in the third chamber portion, which are not filled with a solid material, can be filled with blocks of materials to reduce the area to be evacuated. For example, the second chamber portion has a volume of the evacuatable region and the third chamber portion has a further volume of the further evacuatable region and the ratio of the volume to the further volume is increased by volume reduction blocks to at least 7:1.

As described above, FIG. 1 shows a deposition apparatus 100. The deposition apparatus 100 includes a chamber 102, which can typically be provided such that the vacuum can be generated in the chamber. Thereby, various vacuum processing techniques, and particularly vacuum deposition techniques, can be used to process the substrate or to deposit the thin-film on the substrate. As shown in FIG. 1, and as referred to herein, the apparatus 100 is a roll-to-roll deposition apparatus, bearing a flexible substrate 106 being guided and processed. The flexible substrate 106 is guided in FIG. 1, as indicated by arrow 108, from the chamber portion 102A to the chamber portion 102B and further to the chamber portion 102C having the processing stations therein. The flexible substrate is directed by the rollers 104 to a coating drum 110 configured for supporting the substrate during processing and/or deposition. From the coating drum 110, the substrate 106 is guided to a further roller 104 and into chamber portions 102B and 102A, respectively.

The embodiment depicted in FIG. 1 includes five processing stations, such as 4 deposition stations and 1 etching station. The deposition sources are provided in processing regions, wherein the substrate being supported by the coating drum is processed in the respective areas. Yet, it is to be understood that according to yet further embodiments, which can be combined with other embodiments described herein, five or more processing stations, e.g. deposition stations can be provided. For example, six, seven or even more, such as 8, 10 or 12 processing stations, e.g. deposition stations can be provided. The processing regions are separated from adjacent processing regions or further areas by gas separation units.

According to embodiments described herein, the processing stations and/or their gas separation units are configured to have a varying position to adjust the distance from the coating drum 110. That is the processing stations and/or the gas separation unit can move in a radial direction with respect to the coating drum. The gas separation unit typically includes a wall, which prevents gas in one processing region from entering a neighboring area, such as a neighboring processing region. An element of the gas separation unit provides the slit between the gas separation unit and the substrate 106 or the coating drum, respectively. Thereby, the element defines the length of the slit and the radial position of the element defines the width of the slit between the gas separation unit and the substrate 106.

According to yet further embodiments, which can be combined with other embodiments described herein, the apparatus 100 can further include a pre-heating unit 194 to heat the flexible substrate. Thereby, a radiation heater an e-beam heater or any other element to heat the substrate prior to processing thereof can be provided. Further, additionally or alternatively a pre-treatment plasma source 192, e.g. an RF plasma source can be provided to treat the substrate with a plasma prior to entering the third chamber portion 102C. For example, the pre-treatment with a plasma can provide for a surface modification of the substrate surface to enhance film adhesion of a film deposited thereon or can improve the substrate morphology in another manner to improve processing thereof.

Figure 7:
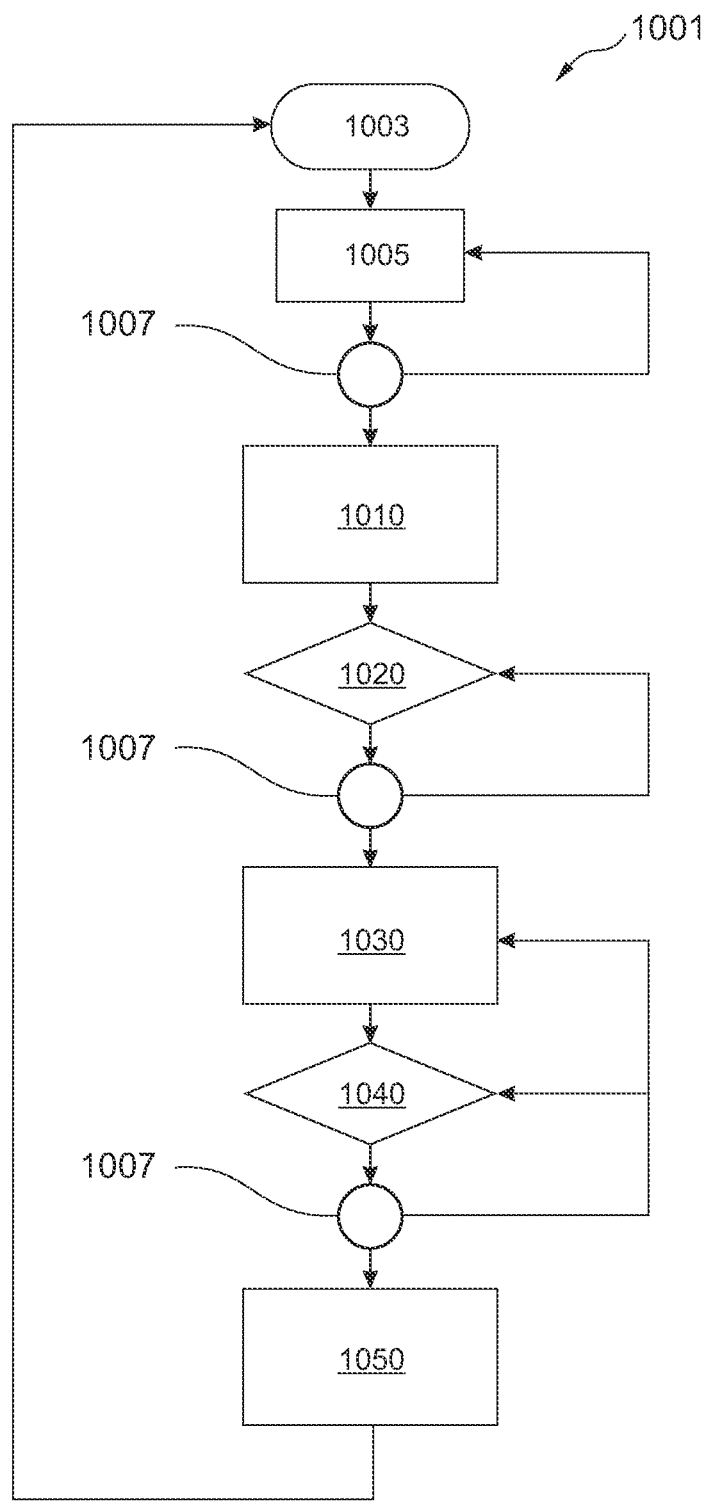

According to embodiments described herein, the above-mentioned method for cleaning the processing chamber of a flexible substrate processing apparatus may include numerous additional steps and/or processes that may be initiated on demand. For instance, FIG. 7 shows a method 1001 for cleaning the processing chamber of a flexible substrate processing apparatus that may be described as follows.

In general, a flexible substrate processing program may be initiated 1003. The flexible substrate may be processed during a processing cycle 1005 in the processing chamber of the apparatus, typically, until a cleaning requirement of the processing chamber is determined 1007. For example, a detection device (e.g. a sensor) may signal that the processing chamber needs to be cleaned due to, for instance, an excessive build-up of contaminants inside of the processing chamber that may, if not removed in time, interfere with the processes occurring in the processing chamber. Cleaning of the processing chamber may also be pre-set, for instance, after a pre-determined amount of time or after a pre-determined length of flexible substrate has been processed. Further, cleaning of the processing chamber may be initiated as part of a loading and/or unloading procedure that includes loading and/or unloading a new roll of flexible substrate into and/or from the flexible substrate processing apparatus. Yet, further according to some embodiments, which can be combined with other embodiments described herein, a plasma monitor can determine the need for a cleaning cycle.

According to yet further embodiments, the need for cleaning, the status of a purge procedure and/or a pump procedure, and the status of a cleaning procedure can be monitored. For example, a monitoring device can be a device measuring the electrode voltage, electrode current, and plasma impedance at the deposition source, e.g. after the match circuit. Additionally or alternatively, also the gas flow into the processing region of the deposition source and out of the processing region of the deposition source can be monitored. For example the pressures at the respective conduits and/or even the gas mixture could be analyzed. The monitoring device, such as a monitoring device measuring the electrode voltage, electrode current, and plasma impedance measured at the deposition source which can be operated during cleaning can be utilized for determining the plasma conditions, e.g. of the deposition plasma but also of the cleaning plasma.

According to some embodiments, which can be combined with other embodiments described herein, the monitoring device can be a CVD process monitor. For example, the monitoring device can measure at least one of the group consisting of: the voltage, the current, the phase, the harmonics, the impedance or, by using an algorithm, the plasma density, of the deposition source, i.e. the source which can also be utilized during cleaning. Accordingly, a non-invasive plasma characterization method can be provided by an impedance sensor measurement. According to different embodiments, the impedance sensor can be used either as a pre-match or a post-match sensor, i.e. for the match circuit or after the match circuit. Thereby, a post-match mounting of the monitoring sensor provides direct information on RF voltages on the electrodes and the actual plasma impedance. Typically, an electronic "fingerprint" of the plasma can be provided, before or during cleaning. The differences in phase angle and/or harmonic signal amplitude can show subtle changes in process conditions, for example onset of process drifts. Accordingly, indirect information on ion flux incident at powered electrode surfaces and, hence, plasma density can be provided, particularly by measurement of the harmonics in the system of powering the deposition source.

According to some embodiments, which can be combined with other embodiments described herein, the processing station can include a plasma enhanced chemical vapor deposition (PECVD) source. The plasma enhanced deposition sources can be operated at a frequency of 2 MHz to 90 MHz, for example a frequency of 40.68 MHz, and an integrated impedance sensor can provide for real time in-line process monitoring and control of respective process parameters, for example, the width of the slit of the gas separation unit and/or the distance of the electrode of the deposition source from the substrate.

Once a cleaning requirement is detected or a threshold (e.g. pre-set amount of time) is reached, sacrificial foil may be guided into the processing chamber 1010. For instance, this may occur when a roll of flexible substrate is used up and the end section thereof, which is connected to sacrificial foil that in its turn may be connected to the roll, pulls the sacrificial foil into the processing chamber. Typically, the sacrificial foil may enter the processing chamber via a gap sluice (i.e. a load lock) and replace the portion of the flexible substrate that was being processed in the processing chamber. The processed flexible substrate may exit the processing chamber as the sacrificial foil enters the processing chamber.

According to embodiments described herein, the processing chamber may stop processing the flexible substrate before the sacrificial foil enters into the processing chamber. However, since the sacrificial foil may be coated with or consist of a very unreactive material, such as stainless steel, it is not necessarily always required that the processing chamber stops processing the flexible substrate upon entry thereof.

Generally, the sacrificial foil may be of the same width as the flexible substrate such that it may cover and protect the surface of a coating drum within the processing chamber. Typically, the sacrificial foil may be of such a length that it extends at least from its point of entry into the processing chamber to its point of exit therefrom. However, the length and width of the sacrificial foil may vary depending on the dimensions of the flexible substrate processing apparatus.

In embodiments described herein, the sacrificial foil may be dimensioned such that once it has been guided into the processing chamber the front and end sections of the sacrificial foil extend on the outside of the processing chamber. Thus, a section from the end of the sacrificial foil may extend from its entry point into the processing chamber towards the outside of the processing chamber (e.g. in the unwinding chamber) and a section from the front of the sacrificial foil may extend from its exit point from the processing chamber towards the outside of the processing chamber (e.g. in a winding-up chamber). According to embodiments herein, the unwinding and winding-up chambers may be provided as a single chamber generally referred to as winding chamber hereinafter.

Typically, the entry and exit point(s) of the flexible substrate and/or sacrificial foil into and out of the processing chamber may include at least one gap sluice or lock, which may close to seal the processing chamber. Generally, after guiding the sacrificial foil into the processing chamber and terminating the processing procedure of the flexible substrate (including, e.g. CVD, PECVD and/or PVD processes), the at least one gap sluice or lock may close to seal, e.g. hermetically seal, the processing chamber.

A first pump and/or purge procedure 1020 may be initiated to remove left over processing gases from the processing chamber. Generally, pumps are activated first to evacuate the processing gases, e.g. highly reactive processing gases, from the processing chamber. Thereafter, purging gases may be introduced into the processing chamber such as Argon and Nitrogen to facilitate the purge process. The purge gases may then be pumped out of the processing chamber. The pumps usually create medium to high vacuums inside of the processing chamber. For example, the vacuum inside of the processing chamber may be anywhere from $10^{-1}$ mbar to $10^{-7}$ mbar, in particular, from $10^{-2}$ mbar to $10^{-6}$ mbar such as $10^{-3}$ mbar. According to some embodiments, some process residues, such as gases or solid materials, might need to be removed before a cleaning step in order to avoid unwanted chemical reactions. This is typically done with a pump-and-purge process. According to some embodiments, which can be combined with other embodiments described herein, the pump and purge processes as described herein can include a plurality of cycles, e.g. at least two or at least 3 cycles of pump down to around $10^{-2}$ mbar or below and a purge with an inert gas, e.g. Ar or $N_2$, up to a pressure of around 10 mbar to 20 mbar. However, for some embodiments pumping only or purging only might be sufficient to prepare the processing apparatus for cleaning.

Typically, the pump and/or purge procedure 1020 may last anywhere from 5 min to 30 min, such as for instance 20 min. Moreover, the procedure may include a plurality of consecutive pump and purge cycles, for instance three cycles that last 5 min each. According to embodiments herein, a detection mechanism (e.g. in the form of a sensor) may detect 1007 if consecutive pump and/or purge cycles are required to remove the processing gases from the processing chamber. The detection mechanism may autonomously initiate the purge and/or cleaning processes.

Generally, after coating procedures that may include highly exothermic reactions, it may be desirable to cool the coating drum of a flexible substrate processing apparatus. Cooling the coating drum may, for instance, occur in an optional step after and/or during the first pump and/or purge procedure.

According to embodiments described herein, a plasma cleaning (e.g. plasma etching) procedure 1030, which may remove impurities and contaminants from the surfaces within the process chamber may be initiated. Typically, the plasma cleaning procedure is initiated after the first pump and/or purge procedure. The plasma cleaning may be initiated by applying RF voltages, which partially and/or fully ionize, for instance, a fluorinated gas introduced into the processing chamber. In embodiments described herein, the processing chamber is kept at low pressures during the plasma cleaning procedure. For instance, the processing chamber is maintained at pressure anywhere from $10^{-1}$ mbar to $10^{-4}$ mbar, such as at $10^{-2}$ mbar.

Typically, the intensity of RF energy may be adjustable in order to control, for instance, the rate of contaminant removal inside of the processing chamber. In general, sufficient RF energy may be applied to produce a high plasma density, which may ensure a high rate of contaminant removal. Moreover, high plasma densities may avoid that underlying layers of contaminants cross-link in three-dimensions thereby creating stable but un-removed new structures. Thus, in embodiments described herein sensors and controllers may be employed to monitor and adjust the plasma density.

According to embodiments described herein, during the plasma cleaning procedure, the coating drum may typically be standing still. The sacrificial foil generally covers the coating drum thereby protecting the surface of the coating drum from the cleaning plasma. As opposed to flexible substrates that may react with the cleaning plasma and be damaged thereby, the sacrificial foil according to embodiments described herein may be inert with respect to the cleaning plasma and thus re-used in other cleaning procedures. This reduces the amount of material (substrate) wasted and may reduce the CoO considerably. Further, the risk of damaging the substrate such that the drum is exposed to the cleaning plasma through damaged portions of the substrate is reduced or avoided.

According to embodiments described herein, the plasma cleaning procedure may vary in duration depending on the degree of contamination and size of the processing chamber. For instance, the plasma cleaning procedure may last from 2 min to 25 min, in particular from 5 min to 20 min, for instance 15 min. According to some embodiments, which can be combined with other embodiments described herein, the time for the cleaning process may be about 10% to 15% of the time for the deposition process. In embodiments herein, the plasma cleaning procedure may also include a series of plasma cleaning cycles interposed with one or more pump and/or purge cycles 1040 that remove the cleaning gas from the processing chamber. For the purpose of clarity these pump and/or purge cycles will be referred to hereinafter as second pump and/or purge procedure.

In embodiments described herein, a detection mechanism may detect 1007 whether contaminants still remain in the processing chamber and may initiate another pump and/or purge procedure 1040, and/or a further plasma cleaning procedure 1030 followed by another pump and/or purge procedure 1040. The detection mechanism may initiate such cleaning procedures multiple times until most or all the contaminants, cleaning and/or processing gases have been removed from the processing chamber.

According to embodiments described herein, after the processing chamber has been cleaned to an acceptable or pre-determined level and the second pump and/or purge procedure 1040 has finished, new flexible substrate to be processed may be guided into the processing chamber 1050. Thereafter, a flexible substrate processing program 1003 may be initiated and the flexible substrate processed 1005 in the processing chamber of the apparatus until another cleaning requirement of the processing chamber is detected 1007.

Generally, the above-described methods for cleaning the processing chamber of a flexible substrate processing apparatus may include any of the following variations and optional steps.

During and in-between the first pump and/or purge procedure 1020 and the second pump and/or purge procedure 1040, a new roll including a new flexible substrate and a new sacrificial foil pre-attached thereto may be loaded into a winding chamber of the flexible substrate processing apparatus without breaking the vacuum in the processing chamber.

The front end of the new flexible substrate may be attached to an end section of the sacrificial foil on the outside of the processing chamber. For this purpose, the flexible substrate processing apparatus may include a splicing device that enables sacrificial foil at the front and/or end of a flexible substrate to be connected or spliced to another flexible substrate.

Explained in more detail, the sacrificial foil, which is pre-attached to the flexible substrate that is being processed in the processing chamber of a flexible substrate processing apparatus, may be guided and/or pulled into the processing chamber via the flexible substrate. The flexible substrate and the sacrificial foil pre-attached thereto may enter the processing chamber via an entry point (i.e. the point of entry into the processing chamber e.g. a gap sluice or a lock). Typically, at the same time as guiding and/or pulling the sacrificial foil into the processing chamber, processed flexible substrate may exit the processing chamber via an exit point (i.e. the point of exit from the processing chamber e.g. a gap sluice or a lock).

Generally, according to embodiments described herein, the sacrificial foil guided and/or pulled into the processing chamber may extend at least from the entry point into the processing chamber to the exit point from the processing chamber. In further embodiments, the front section or end section, or both the front and end sections of the sacrificial foil may extend beyond the exit and/or entry point(s) on the outside of the processing chamber. For instance, the sacrificial foil and/or the flexible substrate may extend on the outside of the processing chamber anywhere from 5 cm to 500 cm, in particular from 20 cm to 160 cm.

Once the sacrificial foil is guided and/or pulled inside of the processing chamber, the exit and/or entry points thereof (e.g. gap sluice(s)) may be closed to hermetically seal the processing chamber. Thereafter, the sacrificial foil may be cut on the outside of the processing chamber in order to remove the winding-up roll and/or unwinding roll from the flexible substrate processing apparatus. The winding-up and unwinding rolls may be replaced with a new winding-up and/or unwinding roll that may subsequently be connected to the cut ends of the sacrificial foil without breaking the vacuum in the processing chamber.

After loading a new roll of flexible substrate into the unwinding (or winding) chamber and connecting (e.g. by splicing) the new flexible substrate or its pre-attached sacrificial foil to an end section of the sacrificial foil as described above, a pumping procedure may be initiated in the unwinding chamber to create low pressure conditions similar to those in the processing chamber. This ensures little to no gas exchange between the processing chamber and the unwinding chamber once the entry and exit points of the processing chamber are opened. Thereby the risk of contaminating the process chamber with gases from the exterior environment is reduced.

In other embodiments herein, it may be desirable to keep the processing chamber at a higher pressure (overpressure) with respect to the unwinding chamber such that contaminants are more effectively hindered from entering into the processing chamber. Vice versa, in further embodiments herein it may be desirable to minimize the risk of processing gases escaping from the processing chamber. Therefore, the unwinding chamber may be kept at a higher pressure (overpressure) than the processing chamber.

Generally, once the plasma cleaning, loading/unloading of a new roll (with and without flexible substrate respectively) and the pump and/or purge processes have terminated the entry and exit points (e.g. gap sluice(s)) may be opened such that a new flexible substrate may be guided into the processing chamber. Generally, at the same time the sacrificial foil may be guided out of the processing chamber through the same entry point or through a separate exit point. Hence, the processing chamber may include a load lock for the flexible substrate and/or sacrificial foil to enter into the processing chamber and an unload lock for the flexible substrate and/or sacrificial foil to exit from the processing chamber. Once the lock or gap sluice has been opened the process run, such as a coating procedure may be initiated.

In further embodiments herein, a roll including a flexible substrate and sacrificial foil arranged in-between the flexible substrate, separating the flexible substrate into two or more distinct sections may be advantageous for the following reasons.

During processing of a flexible substrate, it may happen that the processing chamber of a flexible substrate processing apparatus may either get contaminated or that, for instance, a monitoring device may extrapolate the period of time after which an unacceptable level of contamination in the processing chamber may be reached. Thus, a method for cleaning the processing chamber without breaking the vacuum therein may be initiated before reaching the unacceptable level of contamination and/or when a contamination of the processing chamber is detected.

According to embodiments described herein, the sacrificial foil section of the flexible substrate closest to the processing chamber may be guided and/or pulled by the flexible substrate into the processing chamber before initiating the plasma cleaning procedure without breaking the vacuum in the processing chamber. Generally, the cleaning procedure may include any of the steps described with respect to FIGS. 6-7 above.

Thus, providing a flexible substrate separated by a sacrificial foil into at least two distinct sections may facilitate the cleaning of a processing chamber since unloading the flexible substrate and manually cleaning the processing chamber may be avoided. Consequently, downtimes of the flexible substrate processing apparatus may be minimized thereby reducing the CoO and increasing the through-put of the flexible substrate processing apparatus.

While the foregoing is directed to embodiments of the invention, other and further embodiments of the invention may be devised without departing from the basic scope thereof, and the scope thereof is determined by the claims that follow.

The invention claimed is:

1. A method for cleaning a processing chamber of a flexible substrate processing apparatus without breaking a vacuum in the processing chamber, the method comprising:
   attaching a sacrificial foil at a start or at an end of a flexible substrate, wherein an end section of the sacrificial foil is attached to a front section of the flexible substrate or wherein a front section of the sacrificial foil is attached to an end section of the flexible substrate, wherein the sacrificial foil is abutting and not overlapping with the flexible substrate, and wherein the sacrificial foil is made of a material that is different than a material of the flexible substrate;
   guiding the sacrificial foil into the processing chamber;
   initiating a first pump process in the processing chamber;
   plasma cleaning the processing chamber at a vacuum from $10^{-1}$ mbar to $10^{-7}$ mbar while the sacrificial foil is provided in the processing chamber;
   initiating a second pump process in the processing chamber; and
   guiding the sacrificial foil out of the processing chamber.

2. The method according to claim 1, wherein the first pump process further comprises purging such that a first pump and purge process is provided and wherein the second pump process further comprises purging such that a second pump and purge process is provided.

3. The method according to claim 1, wherein the first pump process further comprises purging such that a first pump and purge process is provided or wherein the second pump process further comprises purging such that a second pump and purge process is provided.

4. The method according to claim 1, wherein guiding the sacrificial foil into the processing chamber includes at the same time guiding the flexible substrate out of the processing chamber.

5. The method according to claim 1, further comprising guiding the flexible substrate into the processing chamber and at the same time guiding the sacrificial foil out of the processing chamber.

6. The method according to claim 1, wherein the sacrificial foil is coated with a metal alloy or consists of a metal alloy.

7. The method according to claim 6, wherein the metal alloy is stainless steel.

8. The method according to claim 1, wherein plasma cleaning the processing chamber includes plasma cleaning the processing chamber with a fluorinated cleaning gas.

9. The method according to claim 1, further comprising cooling of a processing drum in the processing chamber of the flexible substrate processing apparatus.

10. The method according to claim 2, wherein the steps of initiating the first pump and purge process in the processing chamber, plasma cleaning the processing chamber and initiating the second pump and purge process in the processing chamber are repeated a plurality of times before guiding the flexible substrate into the processing chamber.

11. The method according to claim 1, further comprising sealing the processing chamber after guiding the sacrificial foil into the processing chamber and before initiating the first pump process in the processing chamber.

12. The method according to claim 11, further comprising attaching a new flexible substrate to the end section of the sacrificial foil attached to the end section of the flexible substrate on the outside of the processing chamber after sealing the processing chamber.

* * * * *